(12) United States Patent
Hasunuma

(10) Patent No.: US 6,710,392 B2
(45) Date of Patent: Mar. 23, 2004

(54) SEMICONDUCTOR MEMORY DEVICE WITH INCREASED CAPACITANCE AND REDUCED PERFORMANCE FLUCTUATION

(75) Inventor: Eiji Hasunuma, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/218,524

(22) Filed: Aug. 15, 2002

(65) Prior Publication Data

US 2003/0155601 A1 Aug. 21, 2003

(30) Foreign Application Priority Data

Feb. 15, 2002 (JP) ......................................... 2002-037814

(51) Int. Cl.$^7$ ........................................... H01L 27/108
(52) U.S. Cl. ........................ 257/306; 257/303; 257/305; 257/308; 257/309; 257/307
(58) Field of Search ................................. 257/303, 305, 257/306, 308, 309, 300, 307; 438/255, 289, 396, 964; 361/301.4, 301.5, 303, 305

(56) References Cited

U.S. PATENT DOCUMENTS 6,188,099 B1 * 2/2001 Nakatani .................... 257/308
6,238,973 B1 * 5/2001 Pyun ......................... 438/255
6,239,461 B1 * 5/2001 Lee ........................... 438/253

FOREIGN PATENT DOCUMENTS

| JP | 3-127859 | 5/1991 |
| JP | 5-304267 | 11/1993 |

* cited by examiner

*Primary Examiner*—Minhloan Tran
*Assistant Examiner*—Tan Tran
(74) *Attorney, Agent, or Firm*—McDermott, Will & Emery

(57) ABSTRACT

A semiconductor memory device includes a conductive layer filling a contact hole, a bottom electrode having a depression and electrically connected to the conductive layer, a dielectric film formed on the bottom electrode along the depression, and a top electrode formed on the dielectric film. The conductive layer and the dielectric film directly contact each other at a top surface of the conductive layer. The conductive layer contains polycrystalline silicon and dopant having a relatively low concentration and the bottom electrode contains polycrystalline silicon and dopant having a relatively high concentration. The semiconductor memory device can thus have a capacitor small in size and still sufficiently large in capacitance.

15 Claims, 8 Drawing Sheets

US 6,710,392 B2

SEMICONDUCTOR MEMORY DEVICE WITH INCREASED CAPACITANCE AND REDUCED PERFORMANCE FLUCTUATION

BACKGROUND OF THE INVENTION

1. Field of the Invention

The present invention relates generally to semiconductor memory devices and particularly to semiconductor memory devices having a capacitor improved to obtain a sufficient and steady capacitance.

2. Description of the Background Art

Dynamic Random Access Memory (DRAM) has a structure formed of an integration of memory cells each having a single transistor and a single capacitor and it can be relatively readily miniaturized. However, recently as DRAM has more and more highly integrated a capacitor is required to be smaller in size and yet larger in capacitance. This can be achieved for example by increasing a surface area of the capacitor. Furthermore to ensure that the DRAM is reliable the capacitor is also required to have a capacitance free of significant variation.

A capacitor having a capacitance having a value large and free of significant variation is provided in a semiconductor memory device, as disclosed for example in Japanese Patent Laying-Open Nos. 5-304267 and 3-127859. FIG. 13 is a cross section of a semiconductor memory device disclosed in Japanese Patent Laying-Open No. 5-304267.

With reference to FIG. 13, the conventional semiconductor memory device includes a silicon substrate 111 and an interlayer insulation film 112 formed on the substrate. Interlayer insulation film 112 is provided with a contact hole 113 reaching silicon substrate 111. A polycrystalline silicon film 115b is provided to fill contact hole 113 and cover a surface of interlayer insulation film 112. On interlayer insulation film 112 another polycrystalline silicon film 115a and another polycrystalline silicon film 115c are formed. Between polycrystalline silicon films 115b and 115a and between polycrystalline silicon films 115b and 115c, interlayer insulation film 112 has a surface 117 exposed. Polycrystalline silicon film 115b and 115a are divided by a trench for division 118 and so are polycrystalline silicon films 115b and 115c. A surface of trench 118 and polycrystalline silicon films 115a to 115c are covered by another polycrystalline silicon film 119. Polycrystalline silicon films 115a to 115c and 119 form a bottom electrode 120. On bottom electrode 120 a capacitance insulation film 121 is formed and thereon a top electrode 122 is formed of polycrystalline silicon.

FIG. 14 is a cross section showing a process of a method of fabricating the FIG. 13 semiconductor memory device. With reference to FIGS. 13 and 14 a conventional semiconductor memory device fabrication process will be described.

With reference to FIG. 14, on silicon substrate 111 interlayer insulation film 112 is formed. Interlayer insulation film 112 is provided with contact hole 113 reaching silicon substrate 111. A first polycrystalline silicon film is formed to fill contact hole 113 and cover a surface of interlayer insulation film 112. The trench for division 118 reaching a surface of interlayer insulation film 112 divides the first polycrystalline silicon film into a plurality of patterns to form the first polycrystalline silicon films 115a to 115c. The first polycrystalline silicon film 115b is formed through contact hole 113 onto an upper surface of interlayer insulation film 112 integrally. After the division the first polycrystalline silicon films 115a, 115b and 115c each has a surface provided with the second polycrystalline silicon film 119 and interlayer insulation film 112 exposed by trench 118 also has surface 117 provided with film 119. The first polycrystalline silicon films 115a–115c and the second polycrystalline silicon film 119 form bottom electrode 120.

With reference to FIG. 13, capacitance insulation film 121 is formed on a surface of the second polycrystalline silicon film 119 configuring bottom electrode 120 and thereon top electrode 122 is formed of polycrystalline silicon.

As described above, the first polycrystalline silicon film is divided by the trench for division 118, thereon the second polycrystalline silicon film 119 is formed, and they together serve as bottom electrode 120. Bottom electrode 120 can thus contact capacitance insulation film 121 over an increased area. Such a semiconductor memory device can thus have a capacitor having a capacitance larger than a capacitor having a bottom electrode free of a trench for division. Furthermore, the trench for division 118 that is formed on interlayer insulation film 112 can constantly have a depth to surface 117 of interlayer insulation film 112. Accordingly by controlling the second polycrystalline silicon film 119 in thickness the capacitor can have a capacitance free of significant variation.

As has been described above, in the conventional art, polycrystalline silicon is provided through contact hole 113 onto an upper surface of interlayer insulation film 112 integrally. Thus using a single material to form the first polycrystalline silicon film 115b integrally, however, is disadvantageous, as follows:

Typically, bottom electrode 120 is formed of polycrystalline or amorphous silicon doped with an impurity. If an impurity of a high concentration is used to dope the polycrystalline or amorphous silicon in contact hole 113, however, the impurity diffuses into silicon substrate 111. This impairs characteristics of a transistor of a memory cell. This is severely disadvantageous for DRAM, in particular, as the impurity diffused into the substrate impairs refresh function.

Furthermore, if the dopant impurity has a low concentration, a depletion layer disadvantageously results at a portion of bottom electrode 120 that contacts capacitance insulation film 121. With reference to FIG. 15, bottom electrode 120 underlies capacitance insulation film 121. Capacitance insulation film 121 underlies top electrode 122. Bottom and top electrodes 120 and 122 are formed of polycrystalline silicon doped with phosphorus (P) serving as n dopant. Bottom electrode 120 is adapted to have a potential higher than top electrode 122.

Bottom electrode 120, doped with P serving as n dopant, internally has a large number of electrons 131 serving as carrier. Since electrons 131 move away from top electrode 122 having a relatively low potential, a depletion layer 120a free of carrier results in bottom electrode 120 at a portion adjacent to capacitance insulation film 121. Thus between bottom and top electrodes 120 and 122 there exists two dielectrics, capacitance insulation film 121 and depletion layer 120a. The existence of depletion layer 120a results in a capacitor having a capacitance smaller than intended.

Furthermore in the conventional art the trench for division 118 provided in the first polycrystalline silicon film is formed on interlayer insulation film 112 to obtain trench 118 that has a predetermined depth reaching surface 117 of interlayer insulation film 112. In this case, however, the first polycrystalline silicon films 115a and 115c consequently formed by trench 118 are situated on interlayer insulation film 112 and, as seen from a main surface 114 of silicon substrate 111, the capacitor's projected area would be increased. This goes against a current demand for miniaturized capacitors.

SUMMARY OF THE INVENTION

The present invention has been made to overcome the above disadvantages and it contemplates a semiconductor memory device having a capacitor small in size and still sufficiently large in capacitance.

The present invention in one aspect provides a semiconductor memory device including: a semiconductor substrate having a main surface; an interlayer insulation film formed on the main surface of the semiconductor substrate and having a hole reaching the semiconductor substrate; a conductive layer filling the hole; a bottom electrode having a depression and electrically connected to the conductive layer; a dielectric film formed on the bottom electrode along the depression; and a top electrode formed on the dielectric film. The conductive layer contains silicon and dopant relatively low in concentration. The bottom electrode contains silicon and dopant relatively high in concentration.

The semiconductor memory device thus configured has a bottom electrode having a depression along which a dielectric film is formed. It can thus have a capacitor having a larger surface area than a capacitor with a depression-free bottom electrode and hence increased in capacitance. Furthermore, the bottom electrode is heavily doped and a depletion layer introduced at a portion in which the bottom electrode and a dielectric film contact each other can thus be reduced in width. This can prevent the capacitor from having a reduced capacitance otherwise attributed to the fact that the depletion layer exists. Furthermore, a conductive layer that is lightly doped can contribute to reduced diffusion of the impurity to the semiconductor substrate and thus maintained characteristics of a transistor of a memory cell.

The present invention in another aspect provides a semiconductor memory device including: a semiconductor substrate having a main surface; an interlayer insulation film formed on the main surface of the semiconductor substrate and having a hole reaching the semiconductor substrate; a conductive layer filling the hole; a bottom electrode having a depression and electrically connected to the conductive layer; a dielectric film formed on the bottom electrode along the depression; and a top electrode formed on the dielectric film. The bottom electrode contains metal.

The semiconductor memory device thus configured has a bottom electrode having a depression along which a dielectric film is formed. It can thus have a capacitor having a larger surface area than a capacitor with a depression-free bottom electrode and hence increased in capacitance. Furthermore, the metal containing bottom electrode has electrons in abundance. Thus a portion at which the bottom electrode and the dielectric film contact each other can be free of a depletion layer and the capacitor can have a value in capacitance free of a reduction otherwise attributed to the fact that the depletion layer exists.

The present invention in still another aspect provides a semiconductor memory device including: a semiconductor substrate having a main surface; an interlayer insulation film formed on the main surface of the semiconductor substrate and having a hole reaching the semiconductor substrate; a conductive layer filling the hole; a bottom electrode having a depression and electrically connected to the conductive layer; a dielectric film formed on the bottom electrode along the depression; and a top electrode formed on the dielectric film. The depression is formed by partially removing the bottom electrode with a predetermined etchant. The conductive layer has a relatively low etch rate for the predetermined etchant. The bottom electrode has a relatively high etch rate for the predetermined etchant.

The semiconductor memory device thus configured has a bottom electrode having a depression along which a dielectric film is formed. It can thus have a capacitor having a larger surface area than a capacitor with a depression-free bottom electrode and hence increased in capacitance.

Furthermore, with the conductive layer having a relatively low etch rate for the predetermined etchant and the bottom electrode having a relatively high etch rate for the predetermined etchant, the bottom electrode is patterned, as predetermined, with the etchant, whereas the conductive layer is not readily etched thereby, and a depression contacting a top surface of the conductive layer is thus readily formed. The depression thus has a maximal depth and along the depression the dielectric film is provided. The dielectric film and the bottom electrode can thus contact each other over a significantly increased area and the capacitor can thus have a large capacitance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present invention in embodiments will now be described with reference to the drawings.

First Embodiment

Figure 1:
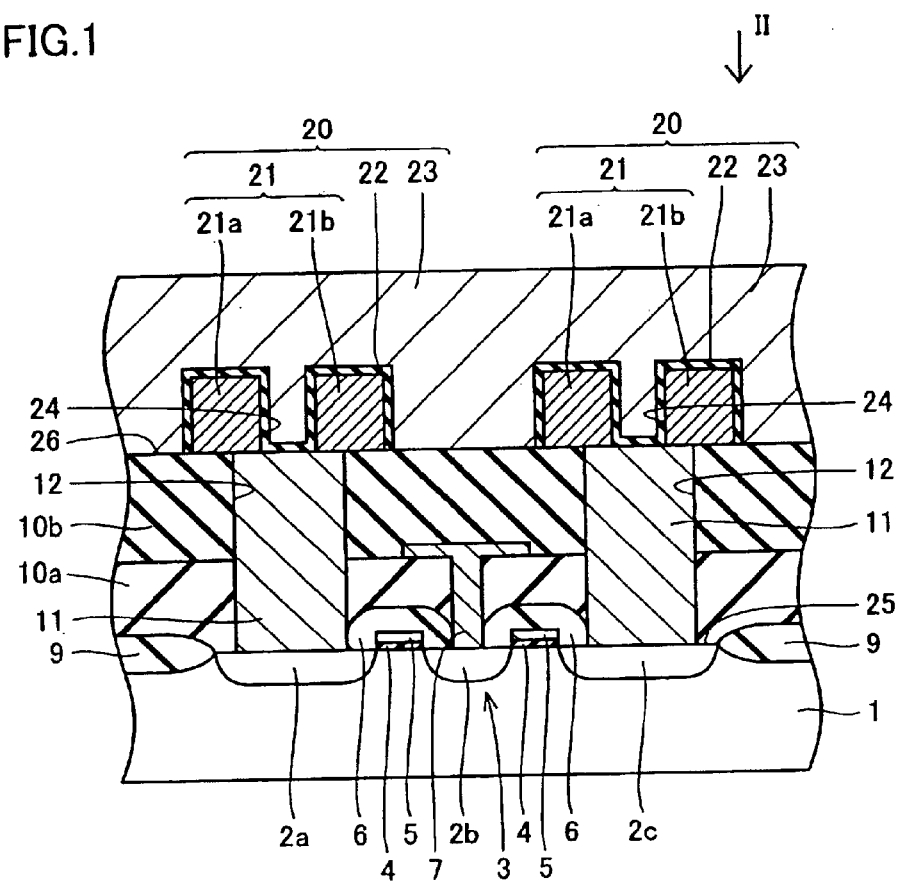
FIG. 1 is a cross section of a semiconductor memory device of the present invention in a first embodiment.

With reference to FIG. 1, the present invention in a first embodiment provides a semiconductor memory device including a silicon substrate 1 serving as a semiconductor substrate and having a main surface 25, interlayer insulation films 10a and 10b formed on main surface 25 and having a contact hole 12 serving as a hole reaching silicon substrate 1, a conductive layer 11 filling contact hole 12, a bottom electrode 21 having a depression 24 and electrically connected to conductive layer 11, a dielectric film 22 formed on bottom electrode 21 along depression 24, and a top electrode 23 formed on dielectric film 22.

Conductive layer 11 contains polycrystalline silicon or amorphous silicon and phosphorus (P) or arsenic (As) serving as dopant to provide a relatively low dopant concentration of less than $1 \times 10^{21}$ cm$^{-3}$. Bottom electrode 21 contains polycrystalline or amorphous silicon and P or As serving as dopant to provide a relatively high dopant concentration of no less than $1 \times 10^{21}$ cm$^{-3}$.

Conductive layer 11 and dielectric film 22 contact each other directly. Conductive layer 11 and interlayer insulation film 10b have their respective top surfaces substantially in a single plane. Bottom electrode 21 includes a plurality of portions 21a and 21b substantially identical in geometry.

Doped regions 2a, 2b and 2c are formed in silicon substrate 1 at main surface 25 with a predetermined distance posed therebetween. Silicon substrate 1 underlies an oxide film for separation 9. Gate electrode 5 is formed on silicon substrate 1 between doped regions 2a and 2b and between 2b and 2c with a gate oxide film 4 posed therebetween. An oxide film 6 is formed to cover gate electrode 5. On silicon substrate 1 a transistor 3 having doped regions 2a, 2b and 2c, gate electrode 5 and gate oxide film 4 is formed. Transistor 3 is covered by interlayer insulation film 10a. Interlayer insulation film 10a has an upper surface adjacent to a bit line 7 contacting doped region 2b. Interlayer insulation film 10a and bit line 7 are covered by interlayer insulation film 10b. Interlayer insulation films 10a and 10b are provided with a contact hole 12 formed to reach doped regions 2a and 2c. Conductive layer 11 is provided to fill contact hole 12 and also have a top surface substantially in the same plain as that of interlayer insulation film 10b. Interlayer insulation film 10b and conductive layer 11 have their respective top surfaces underlying bottom electrode 21. Bottom electrode 21 is divided into the plurality of portions 21a and 21b by a depression 24 reaching conductive layer 11. Bottom electrode 21 is covered by dielectric film 22. Dielectric film 22 is covered by top electrode 23. Bottom electrode 21, dielectric film 22 and top electrode 23 together form a capacitor 20.

Figure 2:
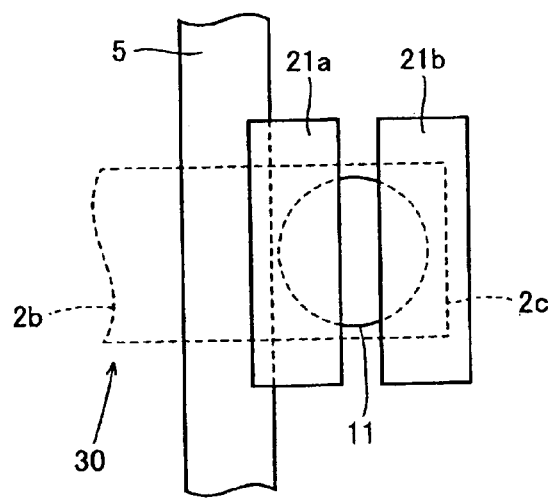
FIG. 2 is a plan view of the FIG. 1 device, as seen in a direction indicated by an arrow II of FIG. 1.

With reference to FIG. 2, bottom electrode 21 is formed of the plurality of portions 21a and 21b of the same, rectangular geometry and spaced, as predetermined, parallel to the direction of a length of gate electrode 5. The plurality of portions 21a and 21b each have a portion overlapping conductive layer 11.

Interlayer insulation films 10a and 10b are formed of an oxide film a source material of which is for example silicon nitride (SiN) film or tetraethylorthosilicate (TEOS). Interlayer insulation films 10a and 10b have a thickness for example of 100 to 1000 nm. Dielectric film 22 is formed for example of silicon nitride (SiN) film, or $Ta_2O_5$ or BST ((Ba, Sr) $TiO_3$) or any other similar highly dielectric film. Dielectric film 22 has a thickness for example of 1 to 50 nm. Top electrode 23 is formed of polycrystalline or amorphous silicon doped with P or As in a concentration of no less than $1 \times 10^{21}$ cm$^{-3}$.

Figure 3:
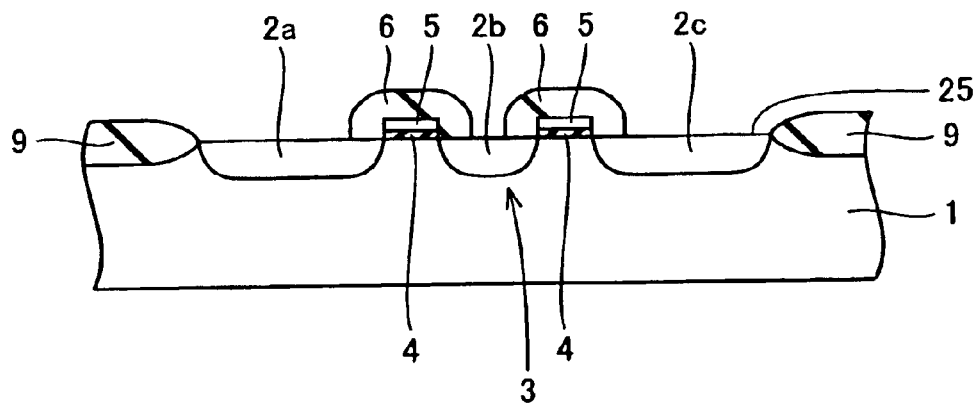
FIGS. 3–7 are cross sections showing steps of a method of fabricating the FIG. 1 device.

With reference to FIG. 3, the oxide film for separation 9 is formed on silicon substrate 1. Gate oxide film 4 and gate electrode 5 formed of a conductor are formed on silicon substrate 1 at main surface 25. Dopant ions are introduced into silicon substrate 1 with gate electrode 5 serving as a mask to form source/drain regions or doped regions 2a, 2b and 2c. Gate electrode 5 is covered by oxide film 6.

Figure 4:
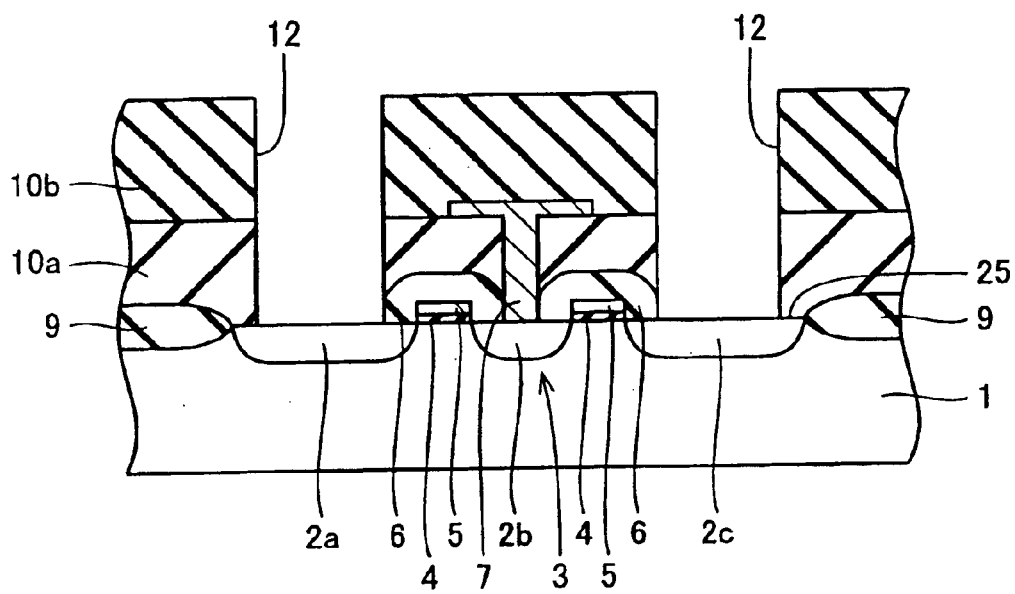

With reference to FIG. 4, after interlayer insulation film 10a is formed bit line 7 is formed. After bit line 7 is formed interlayer insulation film 10b is formed. Interlayer insulation films 10a and 10b are provided with contact hole 12.

Figure 5:
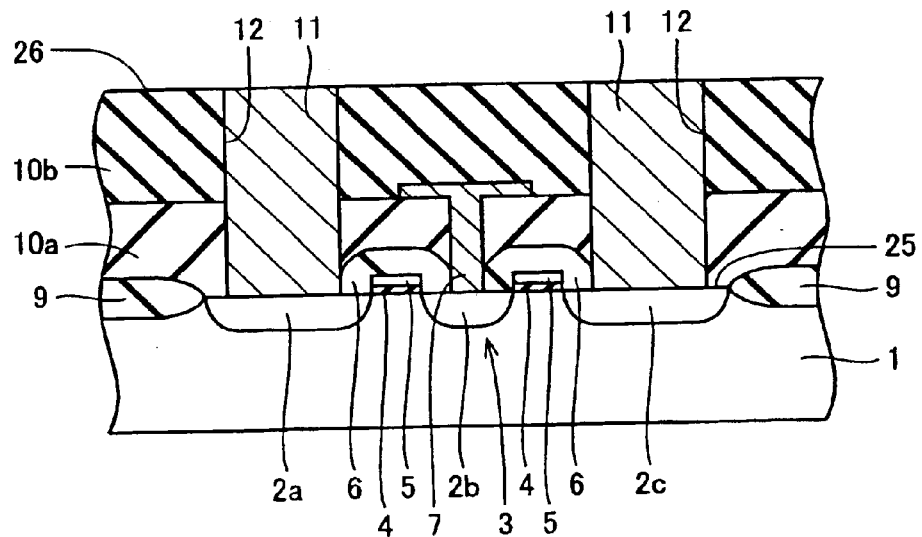

With reference to FIG. 5, polycrystalline or amorphous silicon film serving as a conductor and having a predetermined thickness is provided to fill contact hole 12 and cover the entirety of a surface 26 of interlayer insulation film 10b. The polycrystalline or amorphous silicon is previously doped with P or As to have a dopant concentration of less than $1 \times 10^{21}$ cm$^{-3}$. The polycrystalline or amorphous silicon vapor-deposited on interlayer insulation film 10b is dry-etched and thus removed and interlayer insulation film 10b is then chemically mechanically polished and thus planarized. Conductive layer 11 is thus formed.

Figure 6:
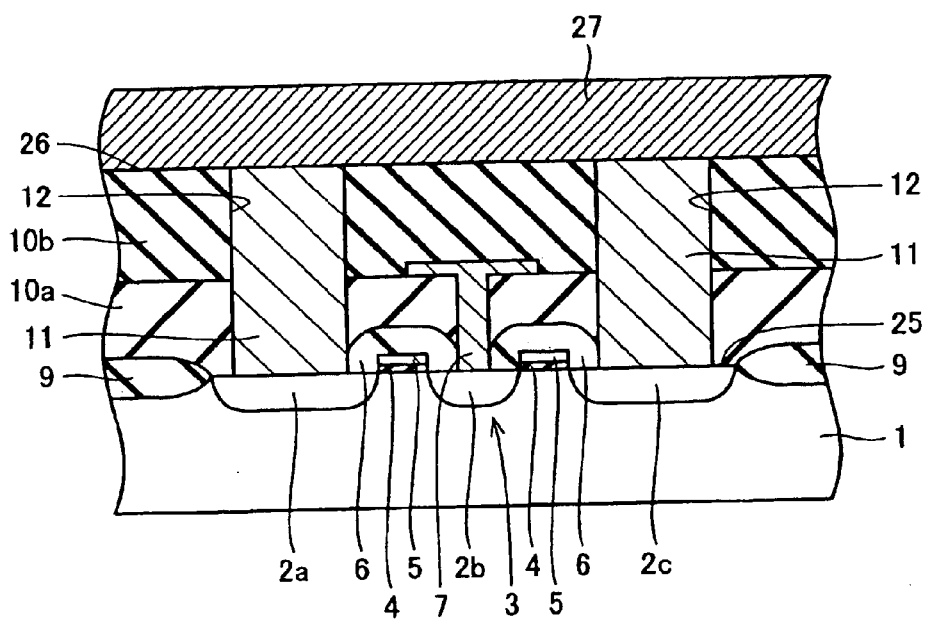

With reference to FIG. 6, surface 26 of conductive layer 11 filling contact hole 12 and interlayer insulation film 10b is covered by a conductive film 27 formed of polycrystalline or amorphous silicon and having a predetermined thickness. Note that the polycrystalline or amorphous silicon is previously doped with P or As to have a dopant content of no less than $1 \times 10^{21}$ cm$^{-3}$.

Figure 7:
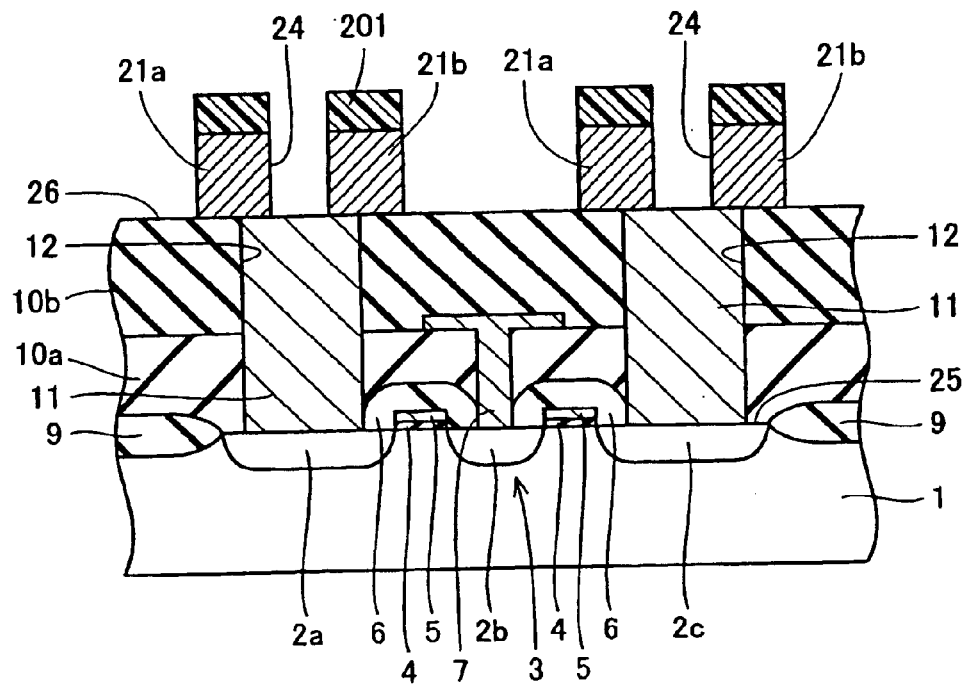

With reference to FIG. 7, conductive film 27 has a surface entirely with photoresist applied thereto and for example exposed to light to form a resist pattern 201 having a predetermined pattern. Resist pattern 201 is used as a mask to etch conductive film 27 to form bottom electrode 21 formed of polycrystalline or amorphous silicon. Resist pattern 201 is then removed.

With reference to FIG. 1, bottom electrode 21 is covered by dielectric film 22. Then, with dielectric film 22 interposed, bottom electrode 21 is covered by top electrode 23 formed of polycrystalline or amorphous silicon serving as a conductor. Note that the polycrystalline or amorphous silicon is previously doped with P or As to have a dopant concentration of no less than $1 \times 10^{21}$ cm$^{-3}$.

Such a semiconductor memory device as described above has bottom electrode 21 having depression 24 along which dielectric film 22 is formed. Bottom electrode 21 thus contacts dielectric film 22 over an area wider than in a capacitor having a bottom electrode free of depression 24. While capacitor 20 has a small size, it can still have an increased capacitance.

Bottom electrode 21 is formed of polycrystalline or amorphous silicon doped with P or As to provide a high dopant concentration of no less than $1 \times 10^{21}$ cm$^{-3}$ and thus at a portion at which bottom electrode 21 and dielectric film 22 contact each other there exist carriers in abundance and a depletion layer introduced in the portion can thus be reduced in width. This can prevent the capacitor from having a reduced capacitance otherwise attributed to the fact that a depletion layer exists. Note that top electrode 23 is also formed of polycrystalline or amorphous silicon doped with P or As to have a high dopant concentration of no less than $1 \times 10^{21}$ cm$^{-3}$. Thus at a portion at which top electrode 23 and dielectric film 22 contact each other there exist carriers in abundance and a depletion layer introduced in the portion can thus be reduced in width and an effect similar to that described above can thus be obtained.

Conductive layer 11 is formed of polycrystalline or amorphous silicon doped with P or As to have a low dopant concentration of less than $1 \times 10^{21}$ cm$^{-3}$. This can reduce diffusion of P or As into silicon substrate 1 and thus maintain characteristics of transistor 3 of the memory cell of interest.

Conductive layer 11 and dielectric film 22 each has a portion directly contacting each other. Thus, depression 24 has a maximal depth and along depression 24 dielectric film 22 is formed, and dielectric film 22 and bottom electrode 21 contact each other over a significantly increased area and the capacitor can thus obtain a large capacitance.

Conductive layer 11 and interlayer insulation film 10b have their respective top surfaces substantially in a single plane. Conductive film 27 for the bottom electrode is thus formed substantially on a flat plane. Thus, subsequent photolithography and etching can be effected with higher precision, and transfer margin can also be improved.

The plurality of portions 21a and 21b are substantially identical in geometry. Thus in forming bottom electrode 21 into a predetermined pattern a reflection of light from an adjacent pattern can be reduced and an effect of the resist's contractility can be reduced. As a result, transfer margin can be improved.

Second Embodiment

Figure 8:
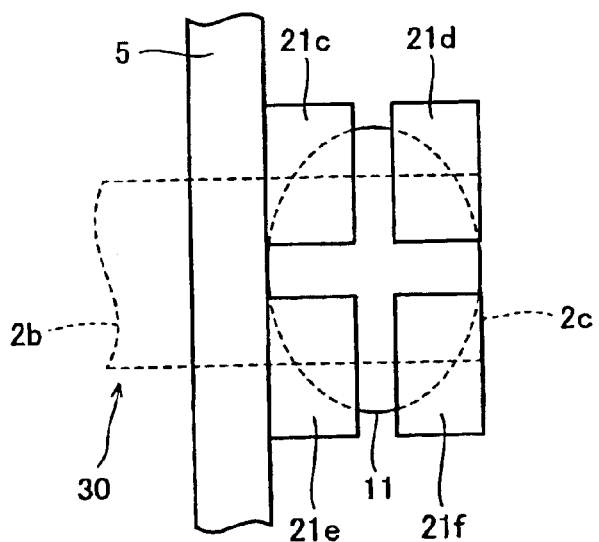
FIGS. 8 and 9 are plan views of the semiconductor memory device of the present invention in second and third embodiments, respectively.

The planer view of FIG. 8 corresponds to that of FIG. 2.

In a second embodiment bottom electrode 21 is shaped, shown in FIG. 8. With reference to FIG. 8, bottom electrode 21 is formed of a plurality of portions 21c–21f formed identically in a rectangle. In the direction of a length of gate electrode 5 the plurality of portions 21c and 21e are formed, spaced as predetermined, and in that same direction parallel to them the plurality of portions 21d and 21f are formed, spaced as predetermined. The plurality of portions 21c–21f each have a portion overlapping conductive layer 11.

Such a semiconductor memory device as described above can be as effective as that of the first embodiment. Furthermore, bottom electrode 21 has depression 24 between the plurality of portions 21c and 21d, between 21e and 21f, between 21c and 21e, and between 21d and 21f, and along depression 24 dielectric film 22 is formed. Thus the capacitor can obtain a surface area larger than a capacitor having a bottom electrode free of the depression and the capacitor can thus have an increased capacitance.

Third Embodiment

Figure 9:
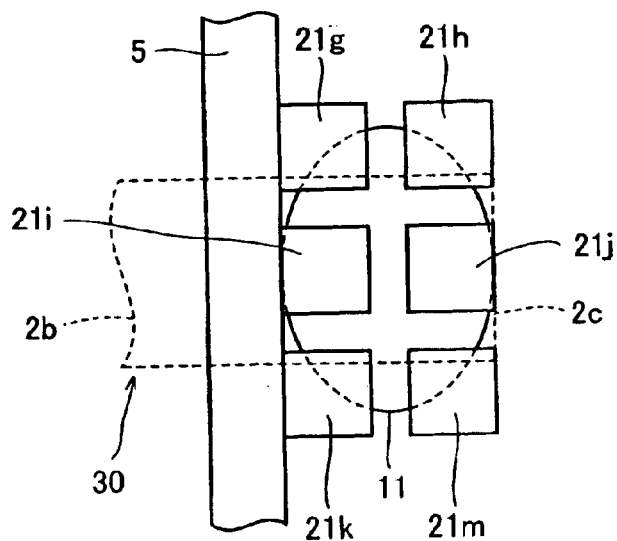

The planer view of FIG. 9 corresponds to that of FIG. 2.

In the third embodiment bottom electrode 21 is shaped, as shown in FIG. 9. With reference to FIG. 9, bottom electrode 21 is formed of a plurality of portions 21g–21m shaped identically in a rectangle. In the direction of a length of gate electrode 5 the plurality of portions 21g, 21i and 21k are formed, spaced as predetermined, and in that same direction parallel to them the plurality of portions 21h, 21j and 21m are formed, spaced as predetermined. The plurality of portions 21g–21m each has a portion overlapping conductive layer 11.

Such a semiconductor memory device as described above can be as effective as that of the first embodiment. Furthermore, bottom electrode 21 has depression 24 between the plurality of portions 21g and 21i, between 21i and 21k, between 21h and 21j, between 21j and 21m, between 21g and 21h, between 21i and 21j, and between 21k and 21m, and along depression 24 dielectric film 22 is formed. The capacitor can thus have a further increased surface area and hence an increased capacitance.

Fourth Embodiment

Figure 10:
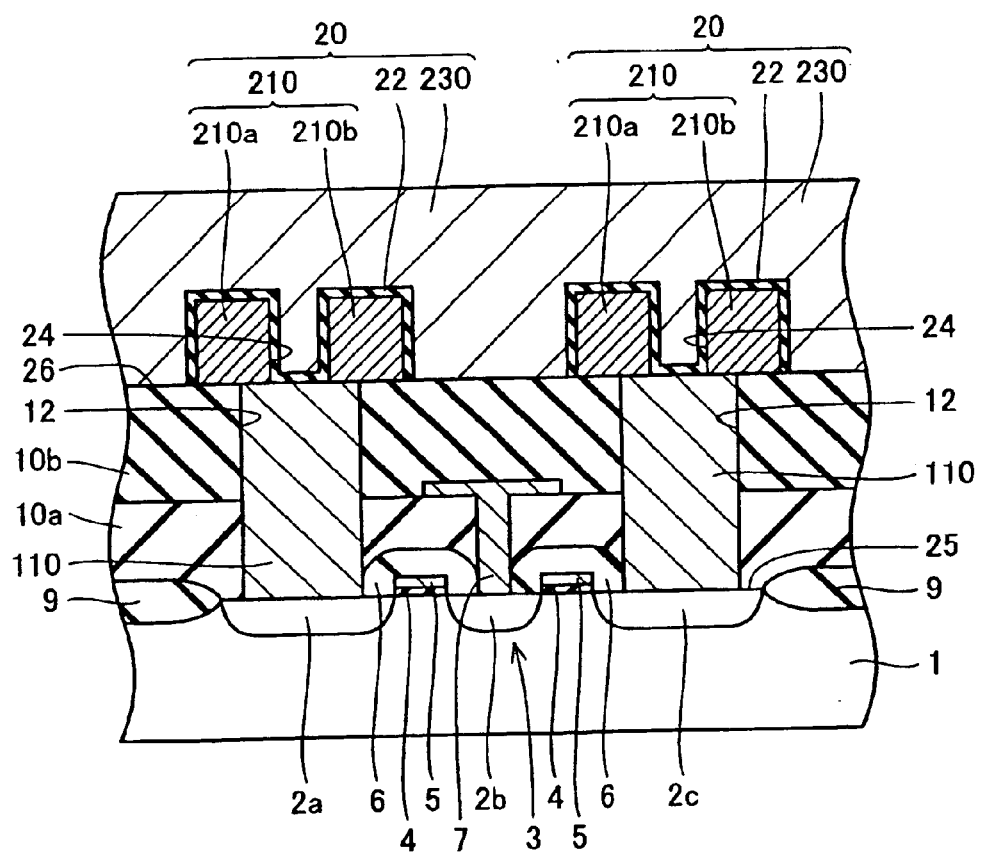
FIG. 10 is a cross section of the semiconductor memory device of the present invention in a fourth embodiment.

In a fourth embodiment, with reference to FIG. 10, bottom and top electrodes 210 and 230 are formed of titanium nitride (TiN) and conductive layer 110 is formed of P-doped polycrystalline silicon.

Bottom electrode 210 contains metal containing titanium nitride serving as at least one selected from the group consisting of titanium nitride, ruthenium and platinum. Conductive layer 110 contains polycrystalline silicon serving as silicon and P serving as dopant.

The FIG. 10 semiconductor memory device is fabricated, as described hereinafter. Initially in the first embodiment the FIGS. 3–6 steps are followed to form on silicon substrate 1 transistor 3, interlayer insulation films 10a and 10b, contact hole 12, conductive layer 110 formed of P-doped polycrystalline silicon, and the like. Surface 26 of conductive layer 110 and interlayer insulation film 10b is covered by conductive film 27 formed of TiN having a predetermined thickness.

With reference to FIG. 7, conductive film 27 has a surface entirely covered with photoresist and for example exposed to light to form resist pattern 201 having a predetermined pattern. Resist pattern 201 is used as a mask to etch conductive film 27 with an etchant of a gaseous mixture of $Cl_2$ and $BCl_3$. Resist pattern 201 is then removed. The P-containing polycrystalline silicon serving as conductive layer 110 has a relatively low etch rate for a gaseous mixture of $Cl_2$ and $BCl_3$ serving as a predetermined etchant and titanium nitride serving as bottom electrode 210 has a relatively high etch rate for the gaseous mixture of $Cl_2$ and $BCl_3$ serving as the predetermined etchant.

With reference to FIG. 10, bottom electrode 210 is covered by dielectric film 22. Then, with dielectric film 22 interposed, bottom electrode 210 is covered by top electrode 230 formed of TiN.

Such a semiconductor memory device as described above has bottom electrode 210 having depression 24 along which dielectric film 22 is formed. Bottom electrode 210 thus contacts dielectric film 22 over an area larger than in a capacitor having a bottom electrode free of depression 24. While capacitor 20 can have a small size, it can also have an increased capacitance.

Conductive layer 110 and dielectric film 22 each has a portion directly contacting each other. Thus, depression 24 has a maximal depth and along depression 24 dielectric film 22 is formed, and dielectric film 22 and bottom electrode 210 contact each other over a significantly increased area and the capacitor can thus obtain a large capacitance.

Conductive layer 110 and interlayer insulation film 10b have their respective top surfaces substantially in a single plane. Conductive film 27 for the bottom electrode is thus formed substantially on a flat plane. Thus, subsequent photolithography and etching can be effected with higher precision, and transfer margin can also be improved.

The plurality of portions 210a and 210b are substantially identical in geometry. Thus in forming bottom electrode 210 into a predetermined pattern a reflection of light from an adjacent pattern can be reduced and an effect of the resist's contractility can be reduced. As a result, transfer margin can be improved.

Bottom electrode 210 is formed of a metal of TiN. Thus at a portion at which bottom electrode 210 and dielectric film 22 contact each other there exist carriers in abundance and a depletion layer introduced in the portion can thus be reduced in width. This can prevent the capacitor from having a reduced capacitance otherwise attributed to the fact that a depletion layer exists. Note that top electrode 230 is formed of TiN serving as metal. Thus at a portion at which top electrode 230 and dielectric film 22 contact each other there exist carriers in abundance and a depletion layer introduced in the portion can thus be reduced in width and an effect similar to that described above can thus be obtained.

The P-containing polycrystalline silicon serving as conductive layer 110 has a relatively low etch rate for a gaseous mixture of $Cl_2$ and $BCl_3$ serving as a predetermined etchant and titanium nitride serving as bottom electrode 210 has a relatively high etch rate for the gaseous mixture of $Cl_2$ and $BCl_3$ serving as the predetermined etchant. Bottom electrode 210 is thus etched by the etchant to form depression 24 in a predetermined pattern, while conductive layer 110 is not readily etched thereby, and depression 24 is thus readily formed to contact a top surface of conductive layer 110. The depression thus has a maximal depth and along the depression the dielectric film is provided. Dielectric film 22 and bottom electrode 210 can thus contact each other over a significantly increased area and the capacitor can thus obtain an increased capacitance. Furthermore, depression 24 formed on conductive layer 110 allows the capacitor to provide a smaller projected area than depression 24 formed on interlayer insulation film 10b, as seen in FIG. 1 in a direction II.

Note that the second and third embodiments with the conditions of the fourth embodiment applied thereto can also be as effective as described above.

Fifth Embodiment

Figure 11:
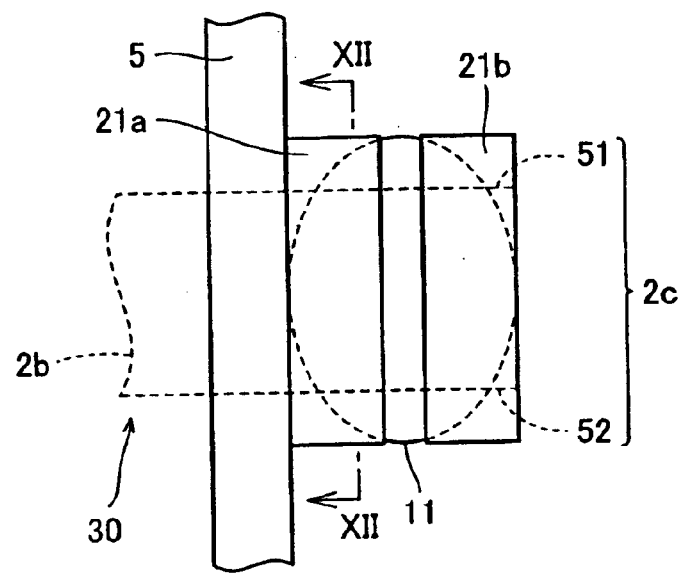
FIG. 11 is a plan view of the semiconductor memory device of the present invention in a fifth embodiment.

The plan view of FIG. 11 corresponds to that of FIG. 2.

Figure 12:
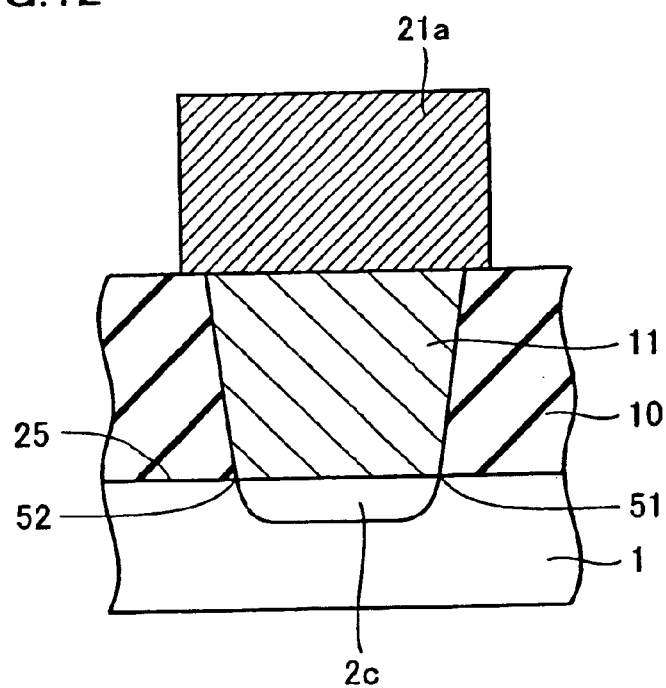
FIG. 12 is a cross section of the FIG. 11 device taken along a line XII—XII of FIG. 11.
Figure 13:
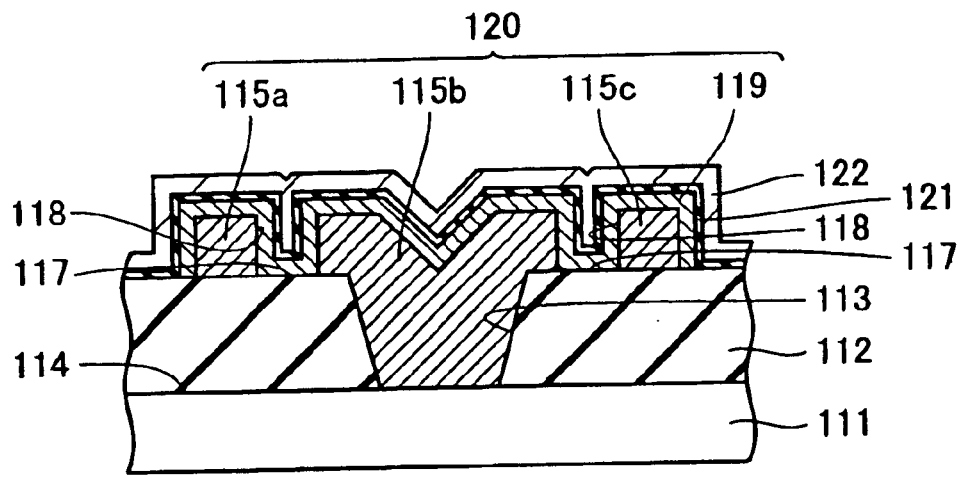
FIG. 13 is a cross section of a semiconductor memory device disclosed in Japanese Patent Laying-Open No. 5-304267.
Figure 14:
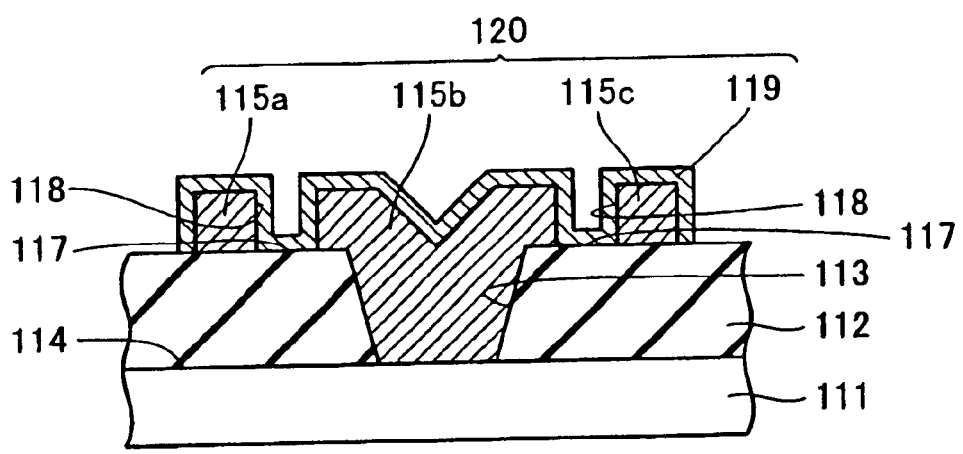
FIG. 14 is a cross section showing a process of a method of fabricating the FIG. 13 device.
Figure 15:
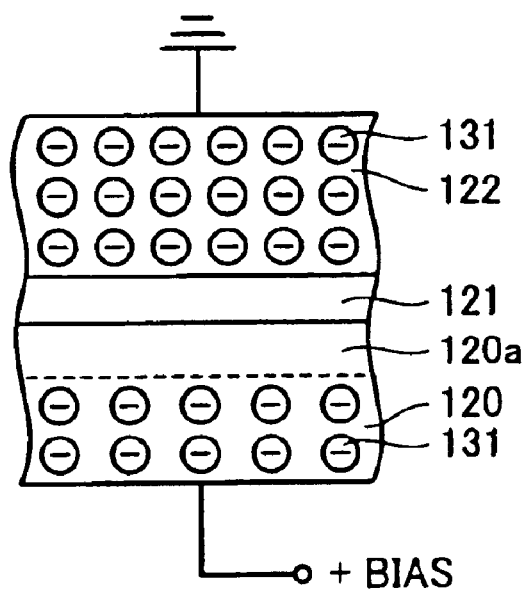
FIG. 15 is a cross section for illustrating that in the FIG. 13 device at a bottom electrode a depletion layer results.

In a fifth embodiment, conductive layer 11 is shaped, as shown in FIG. 11. With reference FIG. 11, doped region 2c at opposite ends thereof has one end 51 and the other end 52 traversing the direction of a length of gate electrode 5 orthogonally. Doped regions 2b and 2c form an active region 30. Conductive layer 11 is shaped in an ellipse having a longer axis in the direction of the length of gate electrode 5. With reference to FIG. 12, doped region 2c contacts conductive layer 11 over the entirety of a surface thereof in main surface 25 of silicon substrate 1.

There is further provided doped region 2c formed in silicon substrate 1 and conductive layer 11 directly contacts doped region 2c. Doped region 2c has one end 51 and the other end 52 and conductive layer 11 directly contacts one end 51 and the other end 52.

Such a semiconductor memory device as described above can be as effective as that of the first embodiment. Furthermore in main surface 25 of silicon substrate 1 doped region 2c has a surface entirely contacting conductive layer 11. This can reduce contact resistance of doped region 2c and conductive layer 11.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a semiconductor substrate having a main surface;
an interlayer insulation film formed on said main surface of said semiconductor substrate and having a hole reaching said semiconductor substrate;
a conductive layer filling said hole;
a bottom electrode having a depression and electrically connected to said conductive layer;
a dielectric film formed on said bottom electrode along said depression; and
a top electrode formed on said dielectric film, said conductive layer containing silicon and dopant relatively low in concentration, said bottom electrode containing silicon and dopant relatively high in concentration.

2. The semiconductor memory device according to claim 1, wherein said dopant in said conductive layer has a concentration less than $1\times10^{21}$ cm$^{-3}$ and said dopant in said bottom electrode has a concentration of no less than $1\times10^{21}$ cm$^{-3}$.

3. The semiconductor memory device according to claim 1, wherein said conductive layer and said dielectric film contact each other directly.

4. The semiconductor memory device according to claim 1, wherein said conductive layer and said interlayer insulation film have their respective top surfaces substantially in a single plane.

5. The semiconductor memory device according to claim 1, wherein said bottom electrode has a plurality of portions substantially identically shaped.

6. The semiconductor memory device according to claim 1, further comprising a doped region fanned in said semiconductor substrate, wherein said conductive layer contacts said doped region directly.

7. The semiconductor memory device according to claim 6, wherein said doped region has one end and the other end and said conductive layer contacts said one end and said other end directly.

8. A semiconductor memory device comprising:
a semiconductor substrate having a main surface;
an interlayer insulation film formed on said main surface of said semiconductor substrate and having a hole reaching said semiconductor substrate;
a conductive layer filling said hole;
a bottom electrode having a depression and electrically connected to said conductive layer;
a dielectric film formed on said bottom electrode along said depression; and
a top electrode formed on said dielectric film, said bottom electrode containing metal, wherein
said conductive layer and said interlayer insulation film have their respective top surfaces substantially in a single plane; and
said conductive layer and said dielectric film contact each other directly.

9. The semiconductor memory device according to claim 8, wherein said conductive layer contains silicon and dopant.

10. The semiconductor memory device according to claim 8, wherein said metal contains at least one selected from the group consisting of titanium nitride, ruthenium and platinum.

11. The semiconductor memory device according to claim 8, wherein said bottom electrode has a plurality of portions substantially identically shaped.

12. The semiconductor memory device according to claim 8, further comprising a doped region formed in said semiconductor substrate, wherein said conductive layer contacts said doped region directly.

13. The semiconductor memory device according to claim 12, wherein said doped region has one end and the other end and said conductive layer contacts said one end and said other end directly.

14. A semiconductor memory device comprising:
a semiconductor substrate having a main surface;
an interlayer insulation film formed on said main surface of said semiconductor substrate and having a hole reaching said semiconductor substrate;
a conductive layer filling said hole;
a bottom electrode having a depression and electrically connected to said conductive layer;
a dielectric film formed on said bottom electrode along said depression; and
a top electrode formed on said dielectric film, said depression being formed by partially removing said bottom electrode with a predetermined etchant, said conductive layer having a relatively low etch rate for said predetermined etchant, said bottom electrode having a relatively high etch rate for said predetermined etchant, wherein said conductive layer and said interlayer insulation film have their respective top surfaces substantially in a single plane, and
said conductive layer and said dielectric film contact each other directly.

15. The semiconductor memory device according to claim 14, wherein said conductive layer contains silicon and dopant and said bottom electrode contains at least one selected from the group consisting of titanium nitride, ruthenium and platinum.

* * * * *